(12) United States Patent
Kang

(10) Patent No.: US 6,872,990 B1
(45) Date of Patent: Mar. 29, 2005

(54) LAYOUT METHOD OF SEMICONDUCTOR DEVICE

(75) Inventor: Tae-Gyoung Kang, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 09/458,506

(22) Filed: Dec. 9, 1999

(30) Foreign Application Priority Data

Dec. 31, 1998 (KR) .......................................... 98-63134

(51) Int. Cl.[7] .................... H01L 27/10; H01L 29/76
(52) U.S. Cl. .................... 257/206; 257/202; 257/204; 257/390; 257/394; 257/401
(58) Field of Search .................... 257/401, 390, 257/394, 202, 204, 206, 207, 208, 210; 438/183

(56) References Cited

U.S. PATENT DOCUMENTS

| | | | | |
|---|---|---|---|---|
| 5,278,105 A | * | 1/1994 | Eden et al. | 437/250 |
| 5,534,724 A | * | 7/1996 | Nagamine | 257/390 |
| 5,748,035 A | * | 5/1998 | Neugebauer | 327/562 |
| 5,923,969 A | * | 7/1999 | Oyamatsu | 438/183 |
| 6,020,616 A | * | 2/2000 | Bothra et al. | 257/381 |
| 6,174,741 B1 | * | 1/2001 | Hansch et al. | 438/14 |

FOREIGN PATENT DOCUMENTS

| | | | | |
|---|---|---|---|---|
| JP | 62-281444 | * | 12/1987 | H01L/21/82 |
| JP | 7-147337 | * | 6/1995 | H01L/21/8247 |
| JP | 9-289251 | * | 11/1997 | H01L/21/82 |

* cited by examiner

Primary Examiner—Ori Nadav
(74) Attorney, Agent, or Firm—Marger Johnson & McCollom, P.C.

(57) ABSTRACT

A semiconductor device layout involving the following: arranging active regions of a plurality of transistors having at least more than one first and second electrodes disposed on a substrate; arranging a plurality of gates of transistors between more than one first and second electrodes of those active regions respectively by positioning at least more than one gates having predetermined width and length at a constant gap on the substrate; and arranging a plurality of dummy gates having predetermined width and length between a plurality of transistors (or between and outside transistors) at the same gap as that of the gates of transistors on the substrate, so that all the gates of transistors are arranged at a constant gap to minimize the variance of process deviations and accordingly reduce the difference of threshold voltage of transistors, thereby increasing reliability of the semiconductor device.

22 Claims, 17 Drawing Sheets

LAYOUT METHOD OF SEMICONDUCTOR DEVICE

FIELD OF THE INVENTION

The present invention relates to a layout method of a semiconductor device, and more particularly to the layout method of the semiconductor device to reduce the variance in process deviations which may occur during photo and etching processes.

BACKGROUND OF THE INVENTION

As progress is made in functions of a system to which a semiconductor device is applied, functions of high speed and high integration in the semiconductor device have become important to the semiconductor device. Accordingly, the layout method is as important as the circuit design and fabricating in response to the trend of high speed and high integration of the semiconductor device.

Some fabricating techniques for conventional semiconductor device, e.g., the uneven light reflection of the photo process and non-uniformity of the etching process, have brought about variances in process deviations at gates of transistors.

The process deviation depends upon the extent of differences in the length of the gates when measured before and after the photo process. Some process deviation is to be expected and is quite acceptable when it is uniform as among various gates. When it is not substantially uniform, i.e., if there is a great variance in the process deviation, the threshold voltage of the transistors fluctuates, thereby leading to malfunctions of the semiconductor device. In other words, the device may operate differently from what the designer intends it to.

Thus, great efforts have been made to minimize the variances in the process deviations which may occur in the course of manufacturing the semiconductor device.

FIG. 1 is a schematic diagram for explaining problems in the photo masking process, one of the manufacturing processes of a semiconductor device, comprising silicon 10, silicon dioxide 12, aluminum 14, photo resist 16, transparent glass 18, and opaque layer 20.

When the photo process is performed with the photo resist 16 being covered over the aluminum 14, the aluminum 14 does not absorb light, instead, the aluminum reflects light as shown in FIG. 1. Moreover, aluminum 14 is disposed in certain areas with a slant angle of θ, and thus reflects light obliquely on the slant surface, so that a photo pattern is not formed precisely as desired.

However, the layout method of the conventional semiconductor device is to arrange gates without a regular gap between gates. The result is that the slant angle of θ as between gates is not kept constant. As a result, the angle of reflecting light becomes different between gates, despite nearly identical photo masking and etching processes, to bring about a potentially wide variance in process deviations at the gates.

FIG. 2 is a schematic diagram for explaining a problem in the etching process, one of the manufacturing processes of the semiconductor device, comprising silicon 10 silicon dioxide 12 and photo resist 16.

As shown in FIG. 2, etching of the oxide layer through open regions of photo resist 16 produces undercut of silicon dioxide 12, as described by circles that increase in radius to the depth of silicon 10. The greater the radius of the circle, the more deeply the photo resist 16 gets undercut. The extent to which the photo resist 16 may be undercut cannot be known until the photo resist 16 is removed. But the shape of the edge of the oxide layer pattern (as shown with dot lines in FIG. 2) is a good indicator of the degree of undercut. In other words, the etching process is not uniform thereby producing undesirable process deviations. These etching process deviation also vary widely between gates having irregular gaps there between.

Therefore, there is a problem in the layout method of the conventional semiconductor device, in that the gates of transistors conventionally are arranged with irregular gaps. As a result, the gates reflect light differently in the photo process and do not uniformly etch the layer in the etching process, thereby increasing process variances.

In addition, as the layout method of neighboring circuits of the conventional semiconductor device is the same as that of the aforementioned general semiconductor device, the extent of process deviations gets bigger during photo and etching processes.

Especially, a sense amplifier of the semiconductor device is a circuit for amplifying and outputting a very small voltage difference of input signals, so that it is very sensitive. Therefore, it is important to correct differences of threshold voltages of transistors which make up the sense amplifier. However, as the layout method of the conventional sense amplifier is the same as that of the general semiconductor device, variances in the process deviations during the photo and etching processes increases.

In other words, the variance in process deviations of the etching process is added to that of the photo process, thereby increasing overall variances in the fabrication process.

As described above, the problems in those photo and etching processes have already been well known, so that it is necessary to minimize the variances in process deviations because the variances in process deviations caused at the gates during those processes may bring about changes in the threshold voltage of transistors.

SUMMARY OF THE INVENTION

It is an object to provide a layout method of a semiconductor device to minimize the variances in process deviations which may occur in photo and etching processes.

It is another object to provide a layout method of neighboring circuits of the semiconductor memory device to minimize the variances in process deviations which may occur in photo and etching processes.

It is also another object to provide a layout method of a sense amplifier of the semiconductor device to minimize the variances in process deviation which may occur in photo and etching processes.

In order to accomplish the aforementioned first object, there is provided a layout method of a semiconductor device comprising the steps of:

arranging active regions of a plurality of transistors having at least more than one first and second electrodes disposed on a substrate;

arranging a plurality of gates of transistors between more than one first and second electrodes of those active regions respectively by positioning at least more than one gates having predetermined width and length at a constant gap on the substrate; and arranging a plurality of dummy gates having predetermined width and length between a plurality of transistors or between and outside transistors at the same gap as that of the gates of transistors on the substrate.

In order to accomplish the aforementioned second object, there is provided a layout method for a neighboring circuit of the semiconductor device, the same method as that of the aforementioned semiconductor device.

In order to accomplish the aforementioned third object, there is provided a layout method for a sense amplifier of a semiconductor device having input transistors for data and control signals in accordance with the aforementioned layout method of a semiconductor device.

DETAILED DESCRIPTION OF THE INVENTION

Figure 1:
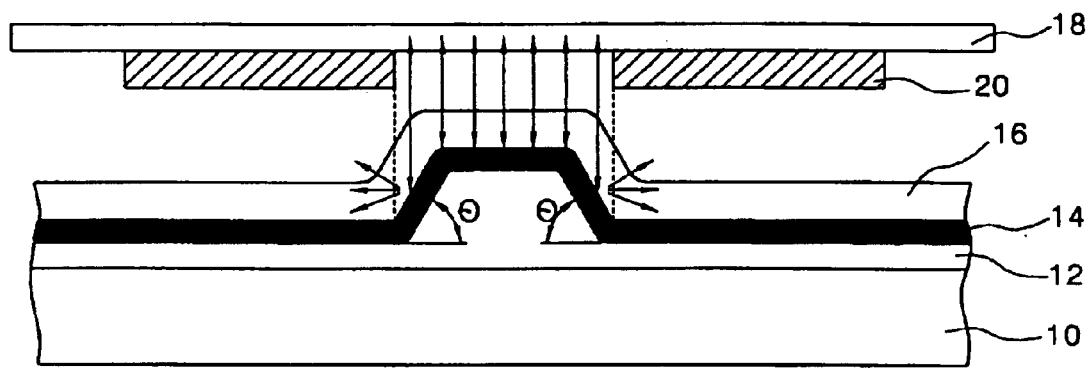
FIG. 1 is a schematic diagram for explaining a problem in a photo process.
Figure 2:
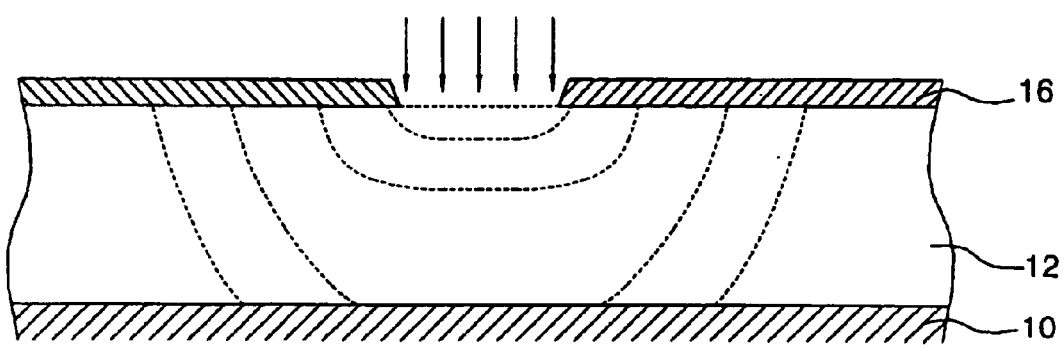
FIG. 2 is a schematic diagram for explaining a problem in an etching process.
Figure 3:
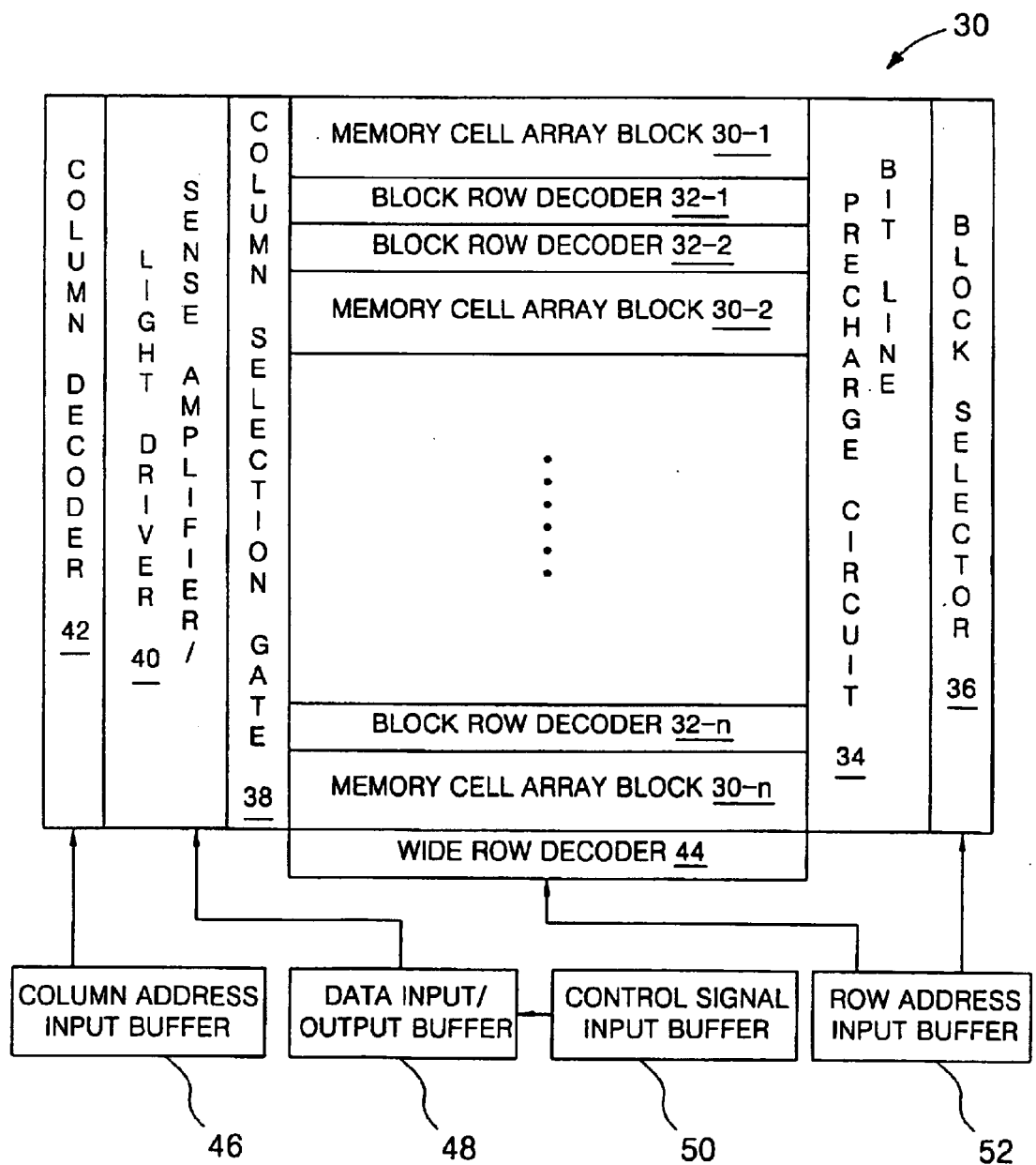
FIG. 3 is a block diagram illustrating the layout of an embodiment of a conventional semiconductor memory device.

FIG. 3 is a block diagram illustrating the layout of an embodiment of a conventional semiconductor memory device, comprising memory cell array blocks 30-1, 30.2 . . . 30n, block row decoders 32-1, 32-2, . . . 32-n, a bit line pre charge circuit 34, a block selector 36, a column selection gate 38, a sense amplifier/light driver 40, a column decoder 42, a wide zone row decoder 44, a column address input buffer 46, a data input/output buffer 48, a control signal input buffer 50 and a row address input buffer 52.

The layout of the prior art semiconductor memory device includes the memory cell array 30 and neighboring circuits of controlling data input/output to the memory cell array 30.

However, there is a problem in the conventional layout method of neighboring circuits of the semiconductor device in that the transistor gates of the neighboring circuits have been arranged at an irregular gap in the conventional layout method of the semiconductor device, thereby increasing variances in process deviations at the transistor gates in the course of the photo and etching processes.

In addition, there is another problem in the conventional layout method of the semiconductor device in that the increase in variances in process deviations as such has caused the semiconductor device not to operate properly as the designer intends it to.

Now, the conventional layout method of the semiconductor memory device and that of the present invention will be compared and explained by using the sense amplifier among the neighboring circuits.

Figure 4:
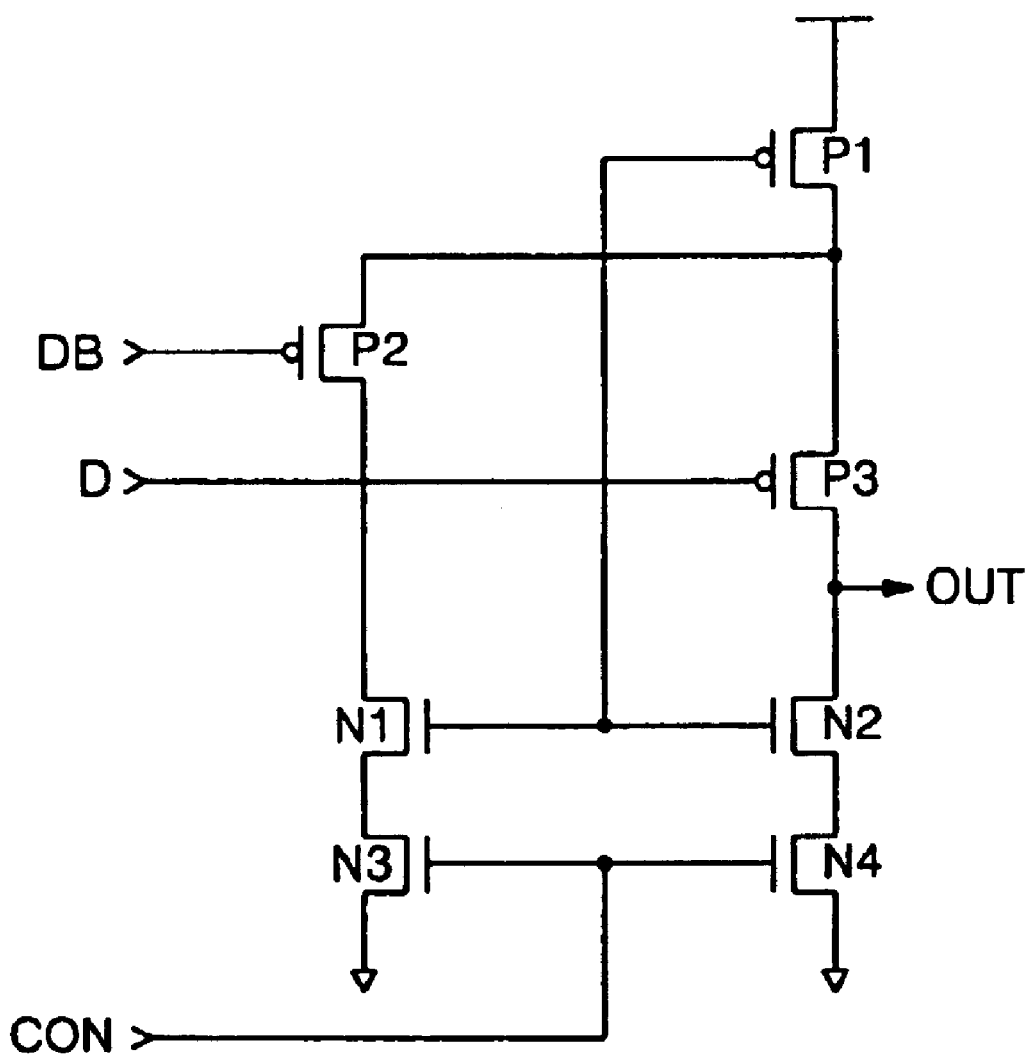
FIG. 4 is a circuit diagram of a conventional sense amplifier.

FIG. 4 is a circuit diagram for illustrating the structure of the conventional sense amplifier, comprising PMOS transistors P1, P2, P3 and NMOS transistors N1, N2, N3, N4. Also shown in FIG. 4 are control signal line CON input signal D, input signal DB and output signal OUT.

FIGS. 5 through 10 illustrate the layout of the sense amplifiers shown in FIG. 4 in accordance with the conventional layout method.

Figure 5:
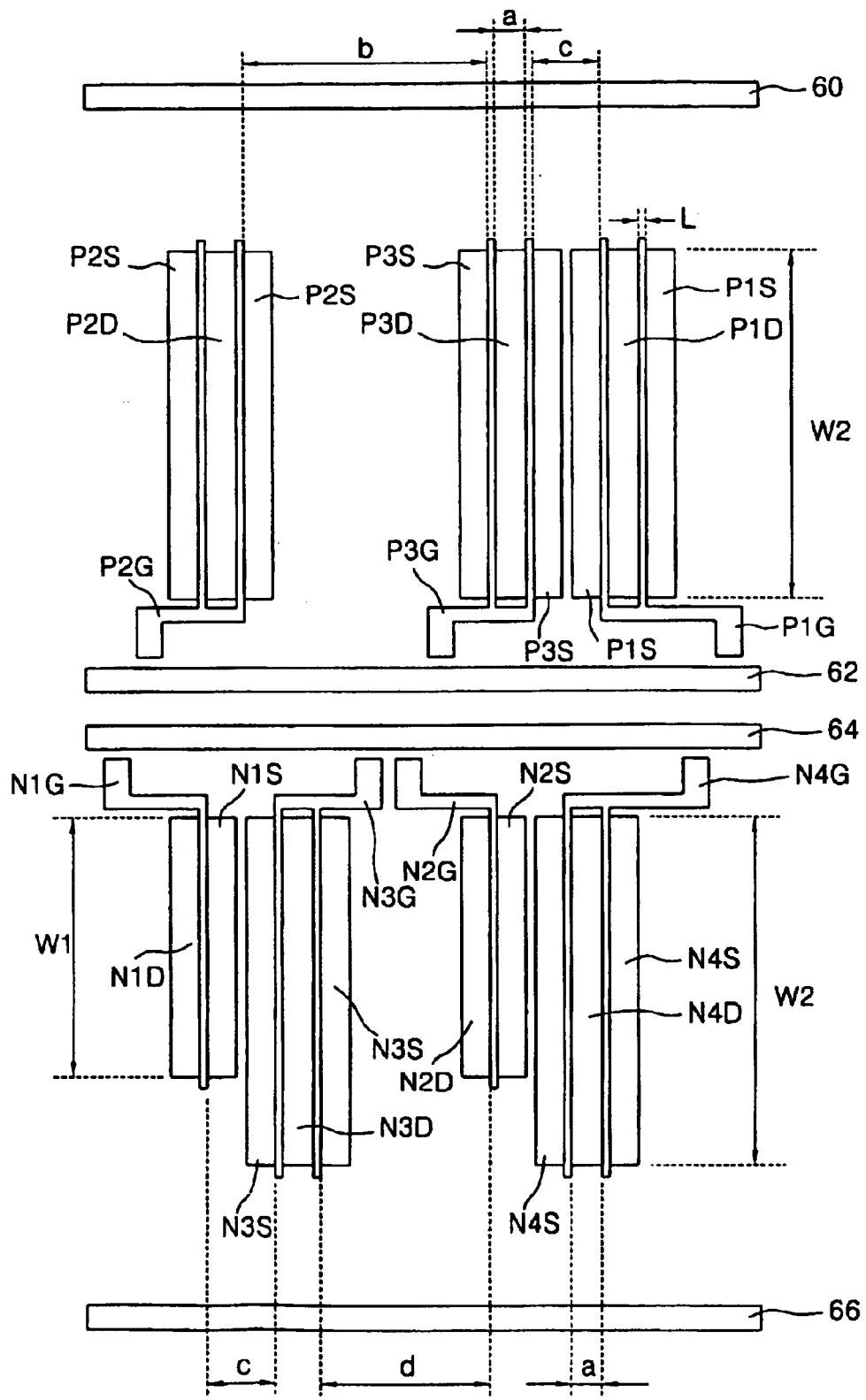
FIG. 5 illustrates the layout of sources, drains and gates of the transistors which make up the sense amplifier.

FIG. 5 illustrates the layout of sources, drains and gates of the transistors which make up the sense amplifier.

In FIG. 5, the sources, drains and gates of the PMOS transistors P1, P2, P3 are respectively denoted with P1S, P2S, P3S, P1D, P2D, P3D, and P1G, P2G, P3G, while the sources, drains and gates of the NMOS transistors N1, N2, N3, N4 are respectively denoted with N1S, N2S, N3S, N4S, N1D, N2D, N3D, N4D and N1G, N2G, N3G, N4G. Reference numerals 60, 66 are bias lines while reference numerals 62, 64 are power lines. In addition, symbols W1, W2 and L are respectively width and length of the transistors.

First of all, the gates of the PMOS transistors P1, P2, P3 and those of the NMOS transistors N1, N2, N3, N4 are divided from one common terminal into two and, then, separately arranged. The width W1 of the gates of the NMOS transistors N1, N2 is smaller than that W2 of the gates of the PMOS transistors P1, P2, P3 and those of the NMOS transistors N3, N4. On the other hand, the length L of the gates of the PMOS transistors P1, P2, P3 is the same as that of the NMOS transistors N1, N2, N3, N4.

According to the conventional layout method shown in FIG. 5, gaps (a) between separate gates of all transistors are constant, while gaps (b, c, d) between the other gates of those transistors are inconstant. Therefore, uneven light reflection in the photo process and non-uniformity of the etching process result in increase in the variances in process deviations.

Figure 6:
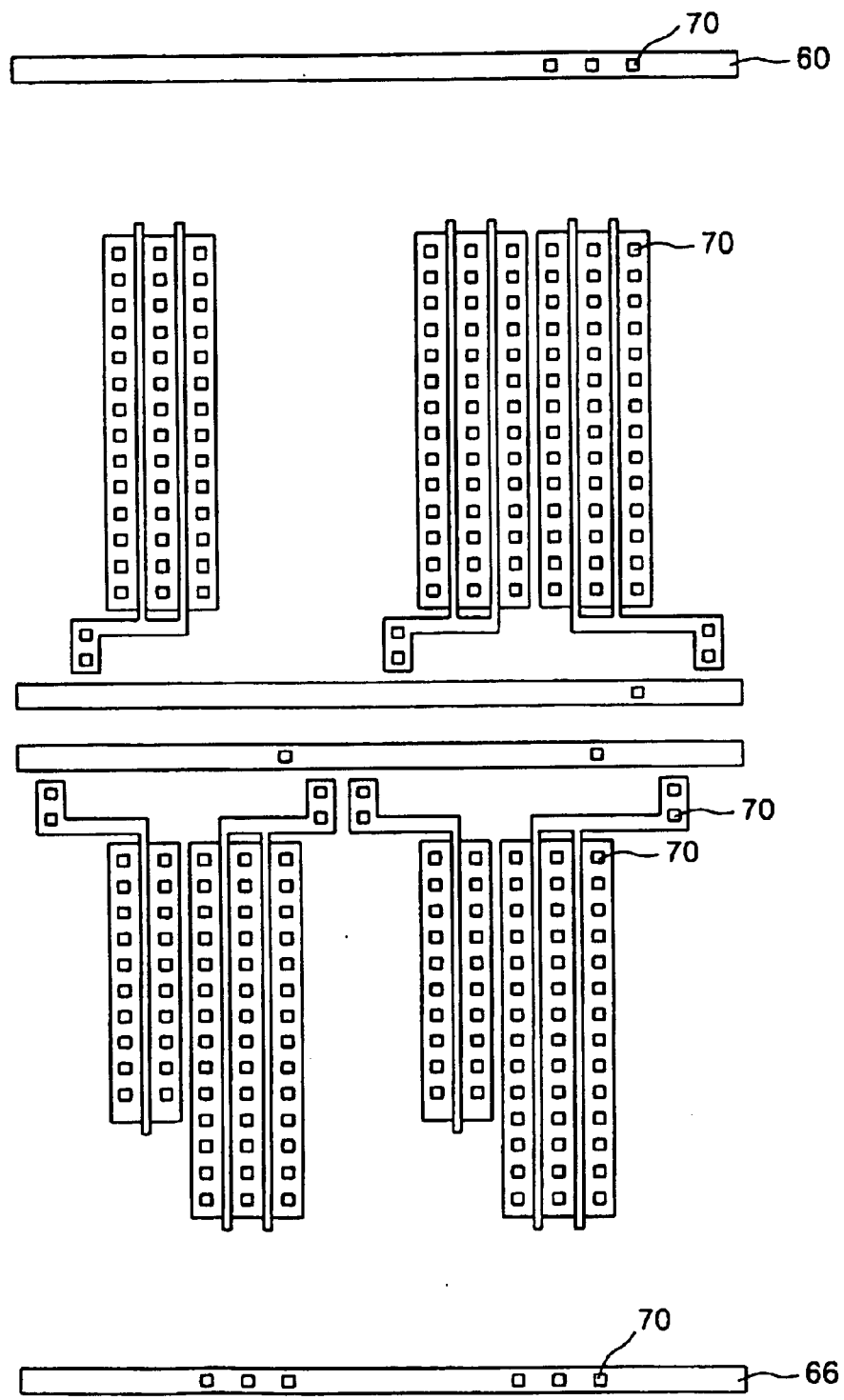
FIG. 6 illustrates contacts formed in the layout shown in FIG. 5.

FIG. 6 illustrates contacts formed in the layout shown in FIG. 5, that is, the contacts being formed on the sources, drains, a gate common terminal, power lines, and bias lines of the PMOS transistors P1, P2, P3 and NMOS transistors N1, N2, N3, N4. In FIG. 6 the portions 70 marked with squares indicate where the contacts are formed.

Figure 7:
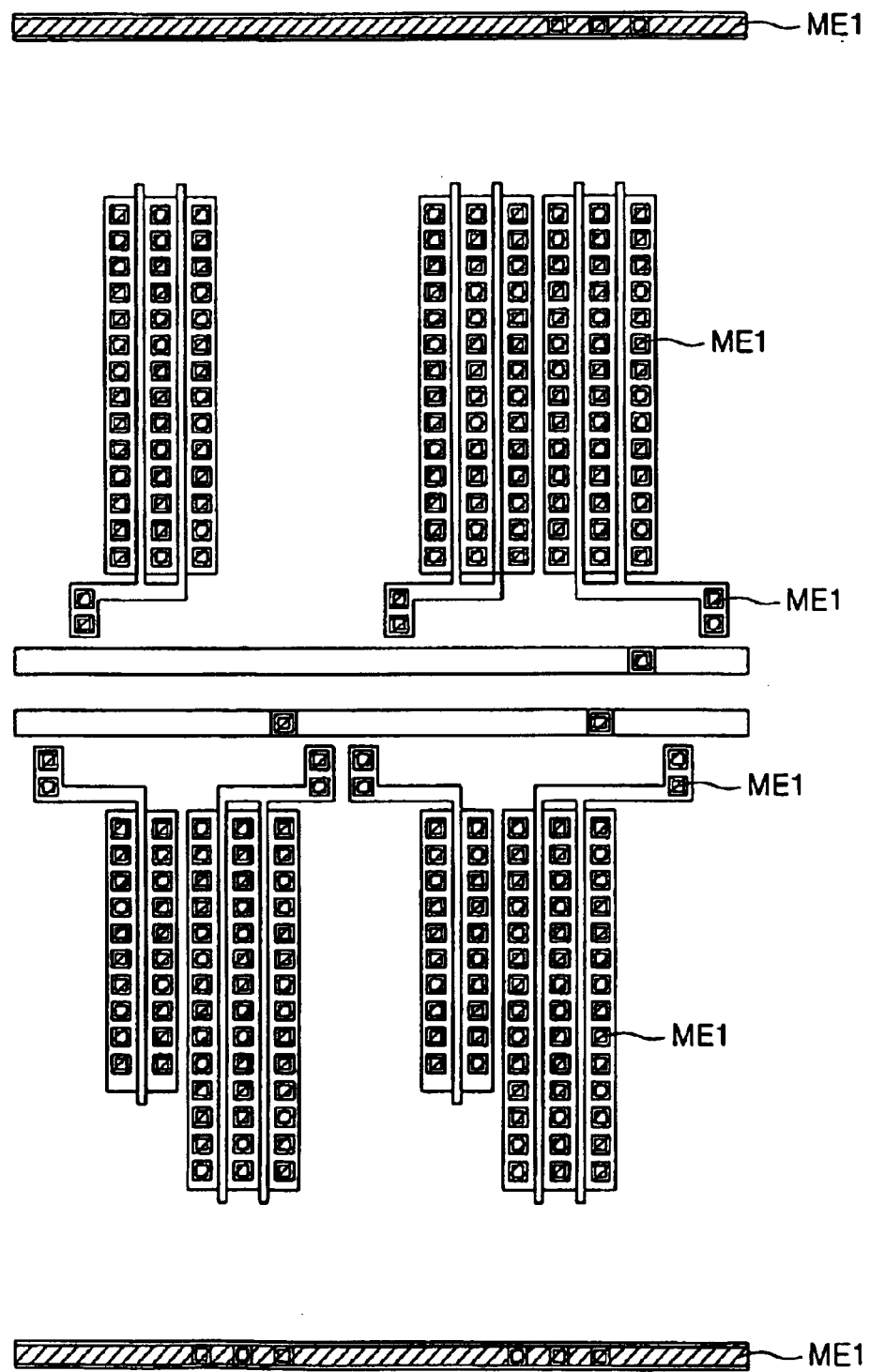
FIG. 7 illustrates metals formed at the contacts shown in FIG. 6.

FIG. 7 illustrates metals ME1 formed at the contacts shown in FIG. 6, that is, the metals being formed all over the contacts 70 and power lines 60, 66 (not visible in FIG. 7). In FIG. 7, the portions marked with horizontally slanting lines indicate where the metals are formed.

Figure 8:
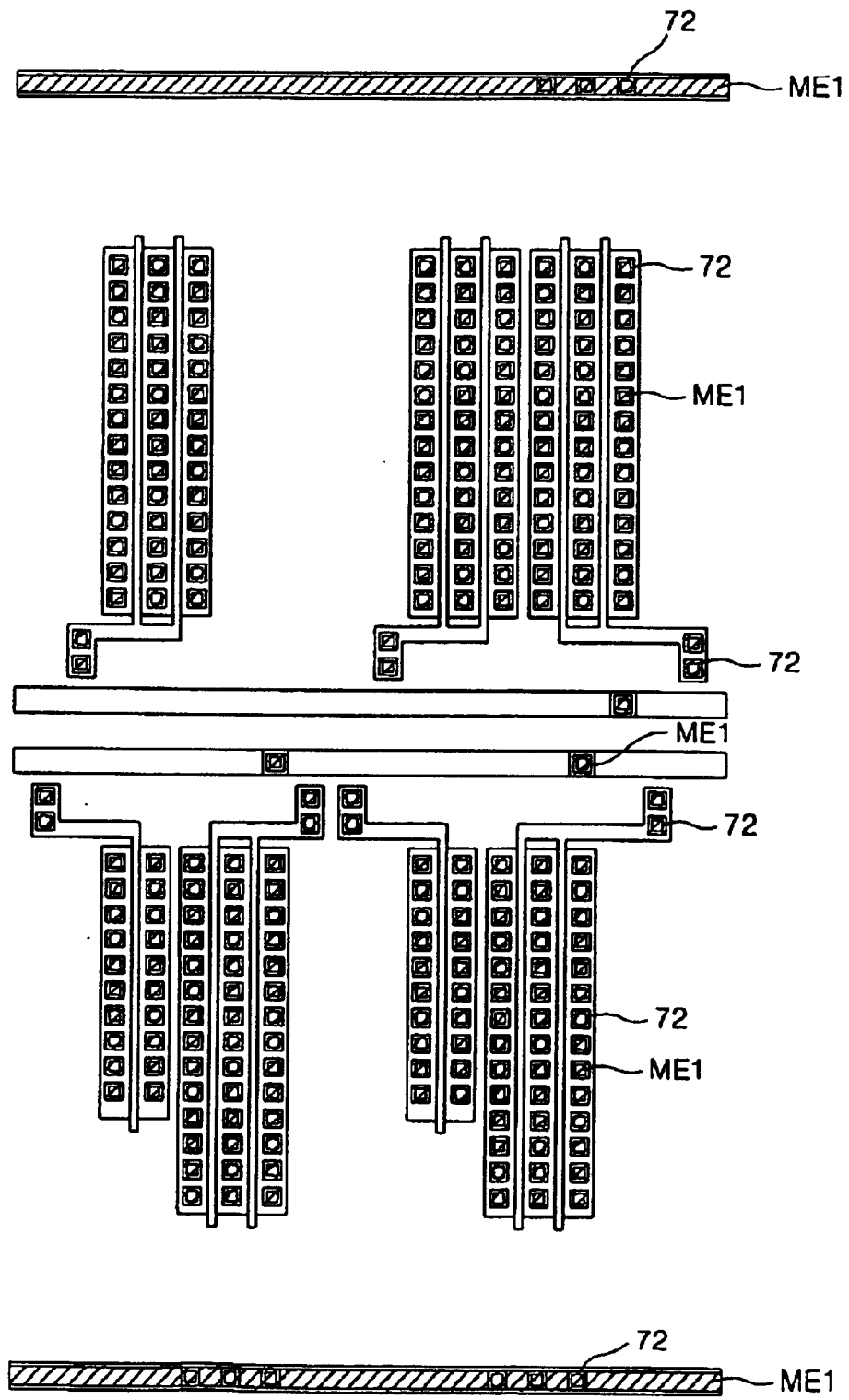
FIG. 8 illustrates contacts formed at the metals shown in FIG. 7.

FIG. 8 illustrates contacts formed at the metals shown in FIG. 7, and the portions 72 marked with dark squares indicate where the contacts are formed.

Figure 9:
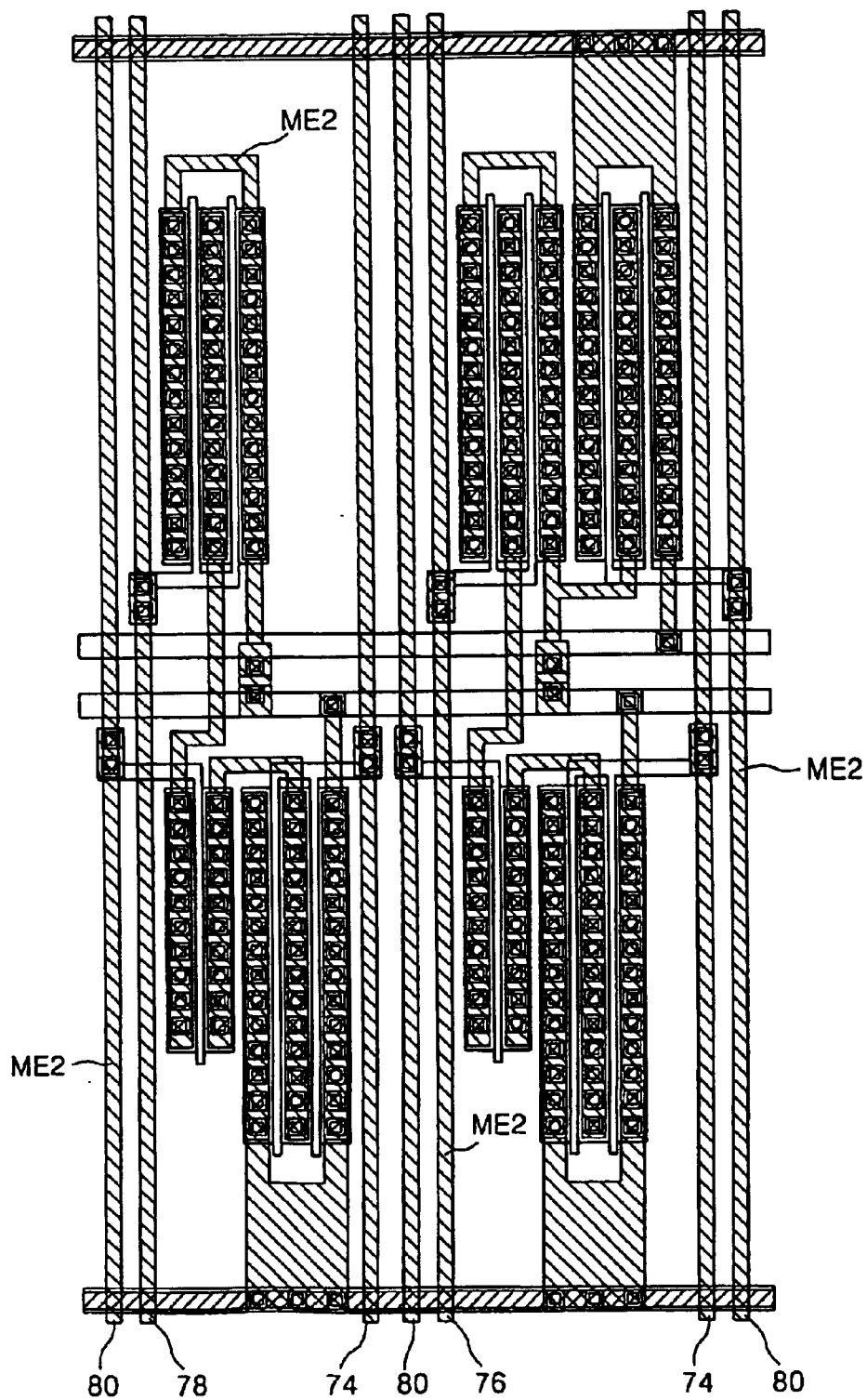
FIG. 9 illustrates metal lines formed along with the contacts shown in FIG. 8.

FIG. 9 illustrates metal lines formed along with the contacts shown in FIG. 8, and the portions ME2 marked with vertically slanting lines are where the metals are formed. Thus, the gates, drains, sources of the transistors of the sense amplifier shown in FIG. 4 are connected by metals. In FIG. 9, the metal lines 74, 76, 78, 80 respectively indicate control signal CON applying line, input signal D applying line, other input signal DB applying line and gate connecting line of the PMOS transistor P1 and NMOS transistors N1, N2.

Figure 10:
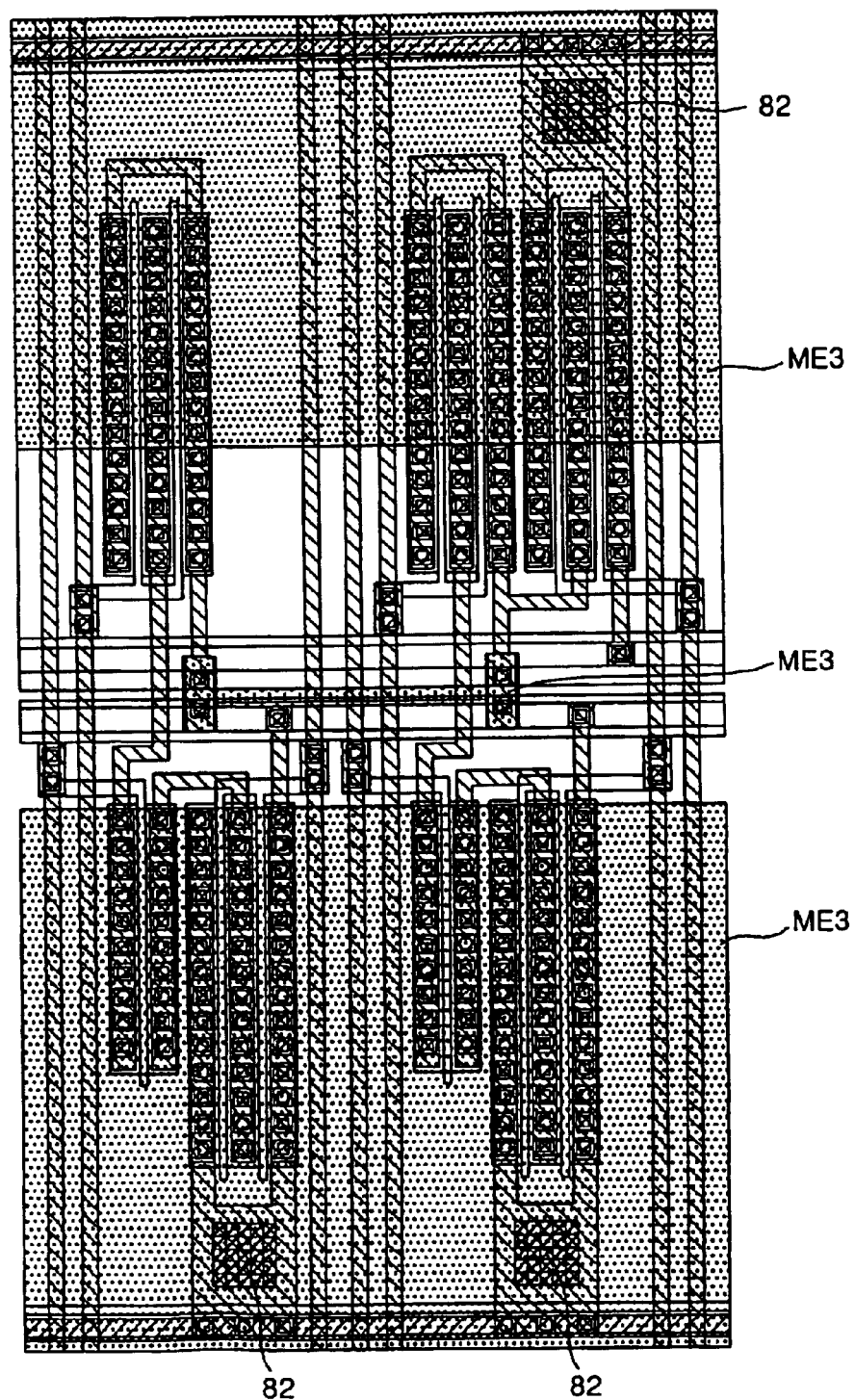
FIG. 10 illustrates metals for applying power voltage and grounding voltage to the metal lines.

FIG. 10 illustrates metals ME3 for applying power voltage and grounding voltage to the metal lines ME2. The striped portions, marked with dots, indicate where the metals ME3 are formed, while the portions 82 marked with lattices indicate where VIA contacts are formed. The portions 82 and metals ME3 are connected to apply the power voltage and grounding voltage.

FIG. 5 has shown the problem in the conventional layout method of the semiconductor memory device. The diagrams shown in FIGS. 6 through 10 have briefly illustrated the layout of the sense amplifier shown in FIG. 4. The inconstancy, or non-uniformity, of gaps on the semiconductor are described and illustrated in FIG. 5 at a, b, and d, and are clear from the non-uniformity of feature column spacing in FIGS. 6–10.

Figure 11:
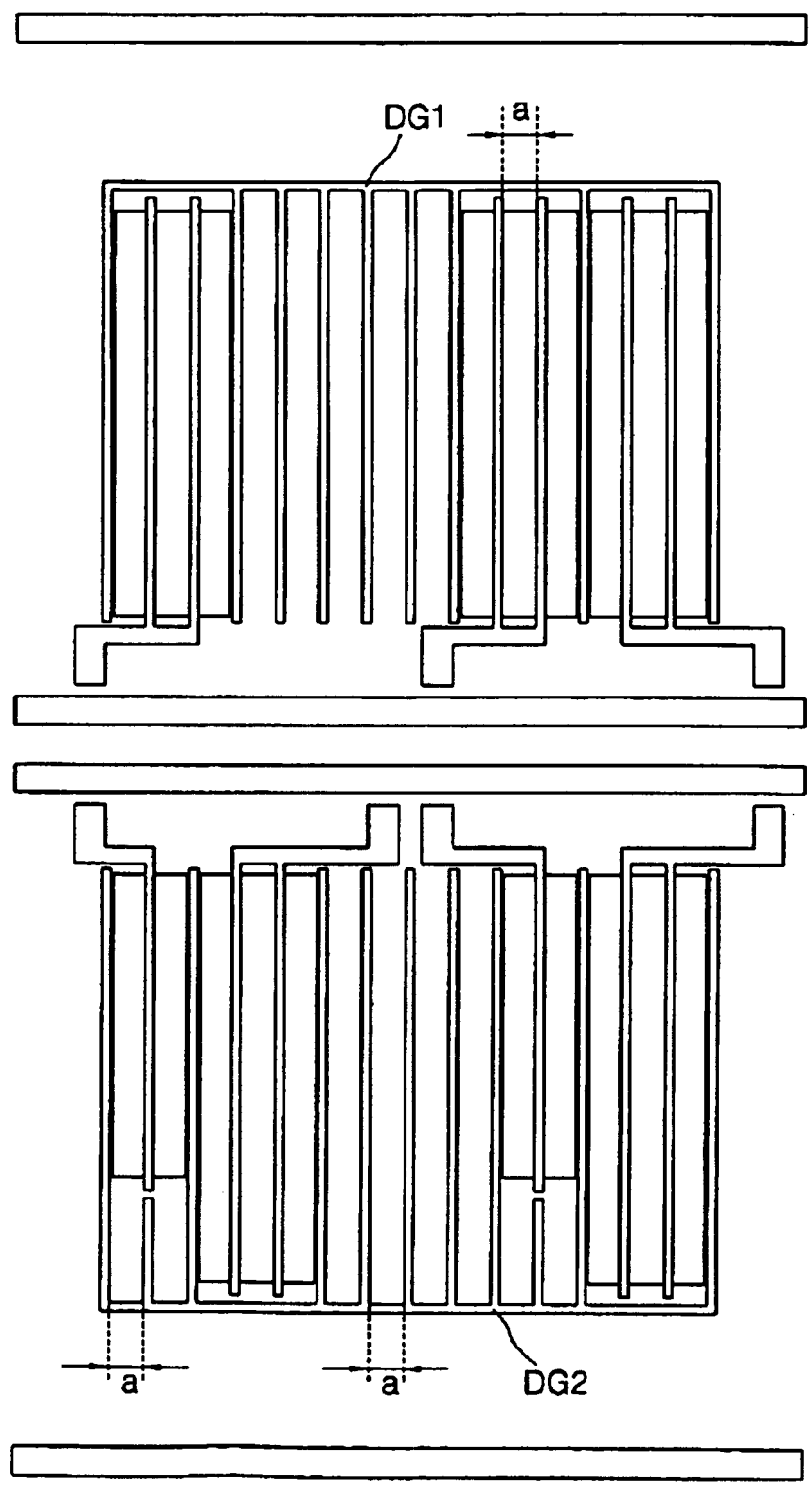
FIG. 11 is a diagram for illustrating the layout of the sense amplifier shown in FIG. 4 in accordance with a layout method of an embodiment of the present invention.

On the other hand, FIG. 11 illustrates a layout of a semiconductor memory device in accordance with an embodiment of the present invention. Dummy gates DG1, DG2 having the same gap (a) as gates divided in the layout shown in FIG. 5 are additionally assembled at the space among gates of the transistors which make up the sense amplifier.

A common line connecting the dummy gates DG1, DG2 is shown in FIG. 11, but it can be properly divided and installed.

The dummy gates thus constructed do not exert any influence upon operations of the circuits of the sense amplifier, but advantageously exert a beneficial influence on the semiconductor fabrication processes.

After all the gates are completely disposed as previously described in FIG. 11, the rest of the layout of the semiconductor device can be arranged according to the conventional or any other layout method.

In other words, according to the layout method of the sense amplifiers of the present invention shown in FIG. 11, there are the gates which perform actual operations of the sense amplifier while the dummy gates are positioned between or outside those actually operating gates without making any influence on the actual operations of the sense amplifier.

However, the installation of the dummy gates minimizes the variances in the process deviations which may occur in the photo and etching processes for the production of the semiconductor device.

FIGS. 12 through 17 illustrate a layout method of the sense amplifier shown in FIG. 4 in accordance with another embodiment of the present invention.

Figure 12:
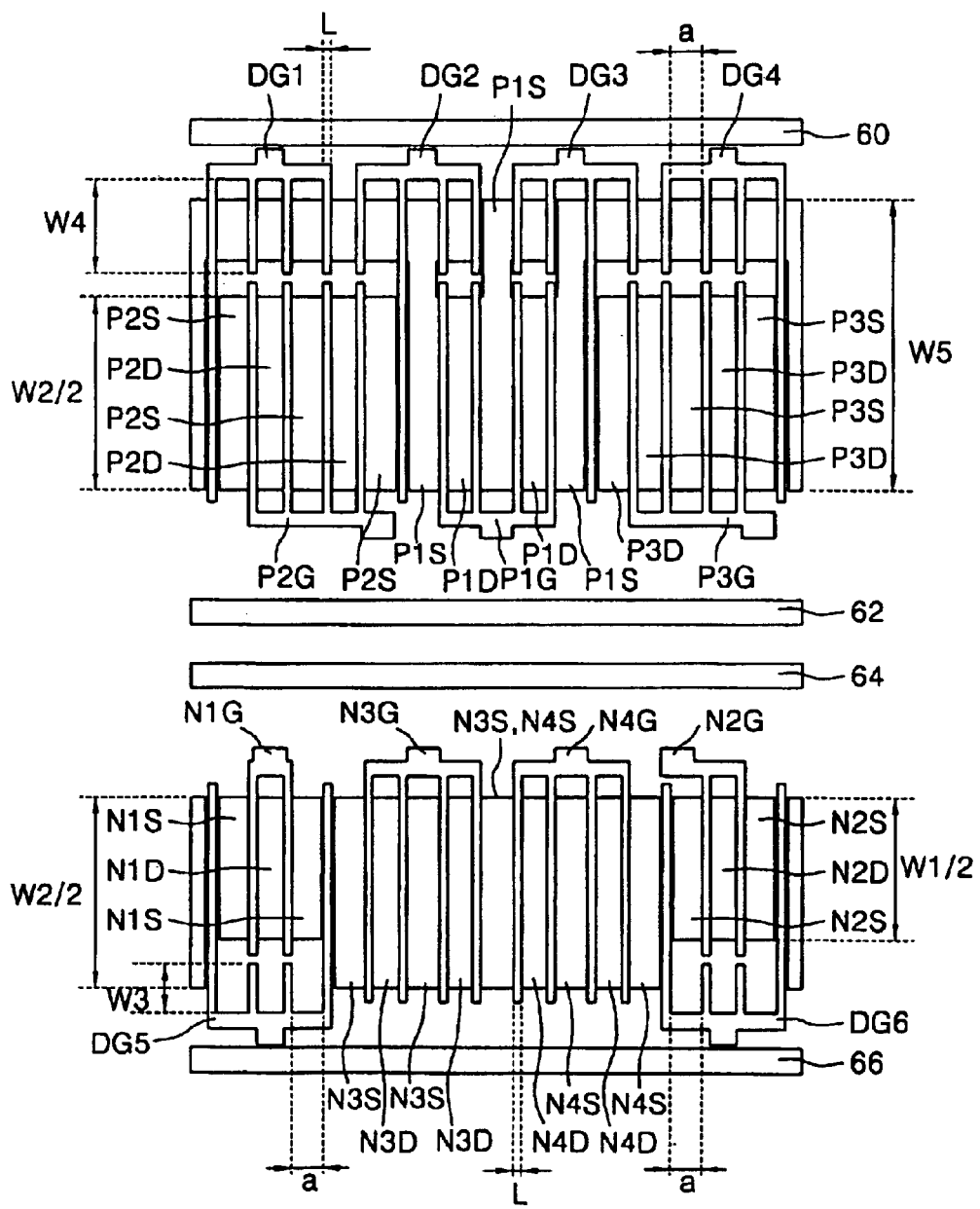
FIG. 12 illustrates a layout method of the sense amplifier as shown in FIG. 4 in accordance with an embodiment of the present invention.

In FIG. 12, the sources, drains and gates of the PMOS transistors P1, P2, P3 are respectively denoted with P1S, P2S, P3S, P1D, P2D, P3D, and P1G, P2G, P3G, while the sources, drains and gates of the NMOS transistors N1, N2, N3, N4 are respectively denoted with N1S, N2S, N3S, N4S, N1D, N2D, N3D, N4D and N1G, N2G, N3G, N4G. Reference numerals 60, 66 are bias lines while reference numerals 62, 64 are power lines. In addition, symbols DG1, DG2, DG3, DG4, DG5, DG6 respectively indicate dummy gates formed at the same gap (a) as that of the gates divided between and outside the transistors.

First of all, gates of the PMOS transistors P1, P2, P3 and those of the NMOS transistors N3, N4 are divided from one common terminal into four and separately arranged. As a result, the sources and drains of the transistors are respectively divided into three and two for the arrangement.

Symbol L indicates the length of the gates of the transistors P1, P2, P3, N1, N2, N3, N4 and that of the dummy gates DG1, DG2, DG3, DG4, DG5, DG6. On the other hand, symbols W2/2, W1/2, W3, W5, and W4 respectively indicate the width of the gates of the PMOS transistors P1, P2, P3 and the NMOS transistors N3, N4, that of the gates of the NMOS transistors N1, N2, that of the dummy gates DG5, DG6, that of the dummy gates DG1, DG4, and that of the dummy gates DG2, DG3. Dummy gate widths W3 and W4 may be seen to vary, as shown, depending upon the placement and gate widths of PMOS transistors P1, P2, P3 and NMOS transistors N1, N2, N3, N4.

As shown in FIG. 12, the gap (a) between the divided gates which compose a single transistor is the same as that between the various transistors.

There is a difference between the layouts shown in FIGS. 5 and 12 in additional arrangement of dummy gates DG1, DG2, DG3, DG4, DG5, DG6.

Although one gate has been divided into four as in the aforementioned embodiment, it will be understood by those skilled in the art that a gate may be divided into more than four.

In the present invention, the gates are arranged at a constant gap (a) as shown in FIG. 12 to thereby reduce the variances in process deviations.

Figure 13:
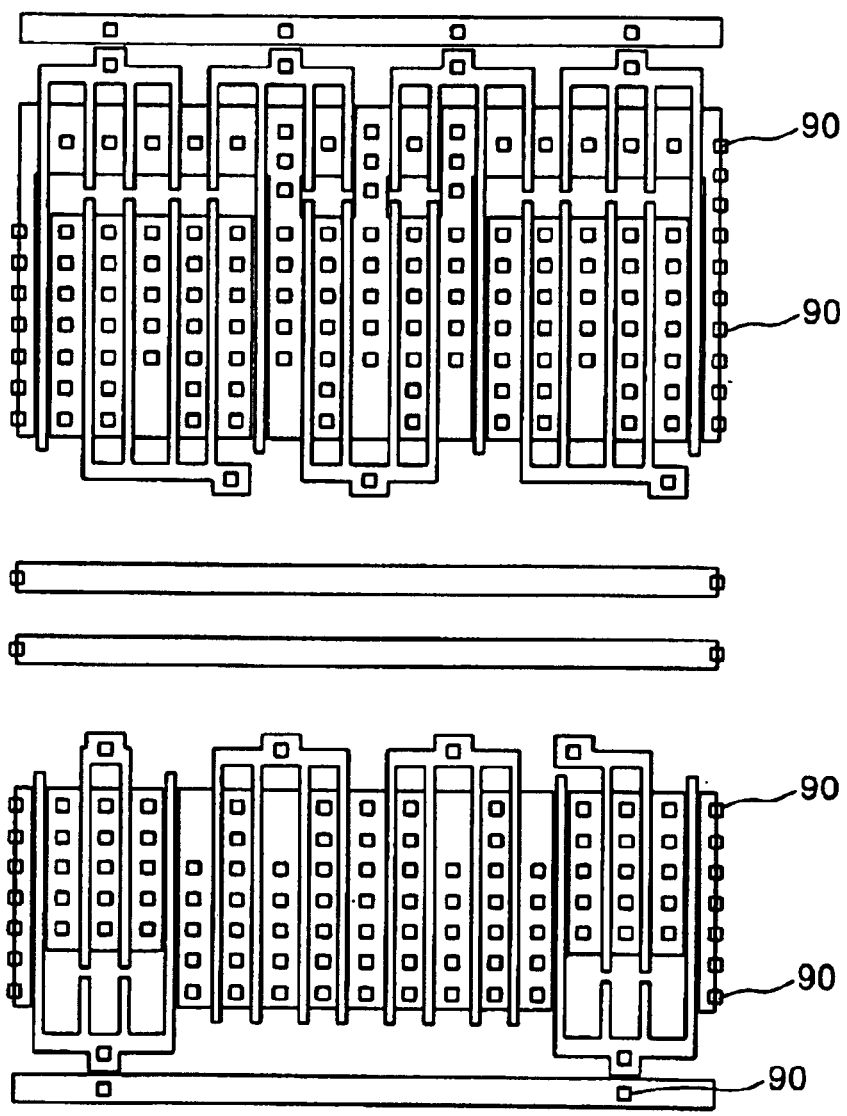
FIG. 13 illustrates contacts formed in the layout shown in FIG. 12.

FIG. 13 illustrates contacts formed in the layout shown in FIG. 12, that is, the contacts being formed on the sources, drains, gate common terminals and bias lines of the PMOS transistors P1, P2, P3 and NMOS transistors N1, N2, N3, N4. In FIG. 13 the portions 90 marked with squares indicate where the contacts are formed.

Figure 14:
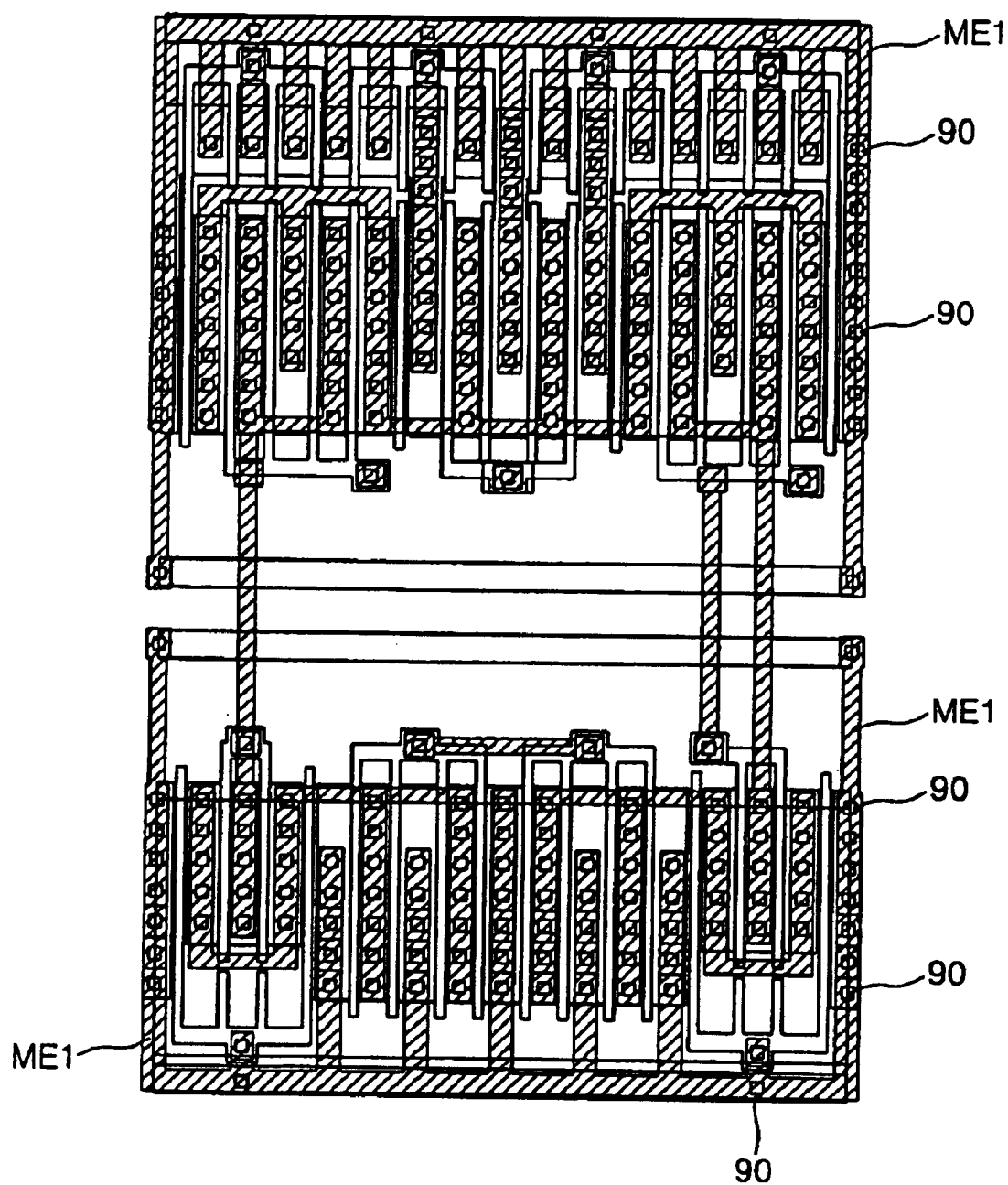
FIG. 14 illustrates metals formed at the contacts shown in FIG. 13.

FIG. 14 illustrates metals ME1 formed at the contacts shown in FIG. 13, that is, the metals being formed all over the contacts 90 and power lines 60, 66. In FIG. 14, the portions ME1 marked with horizontally slanting lines indicate where the metals are formed.

Figure 15:
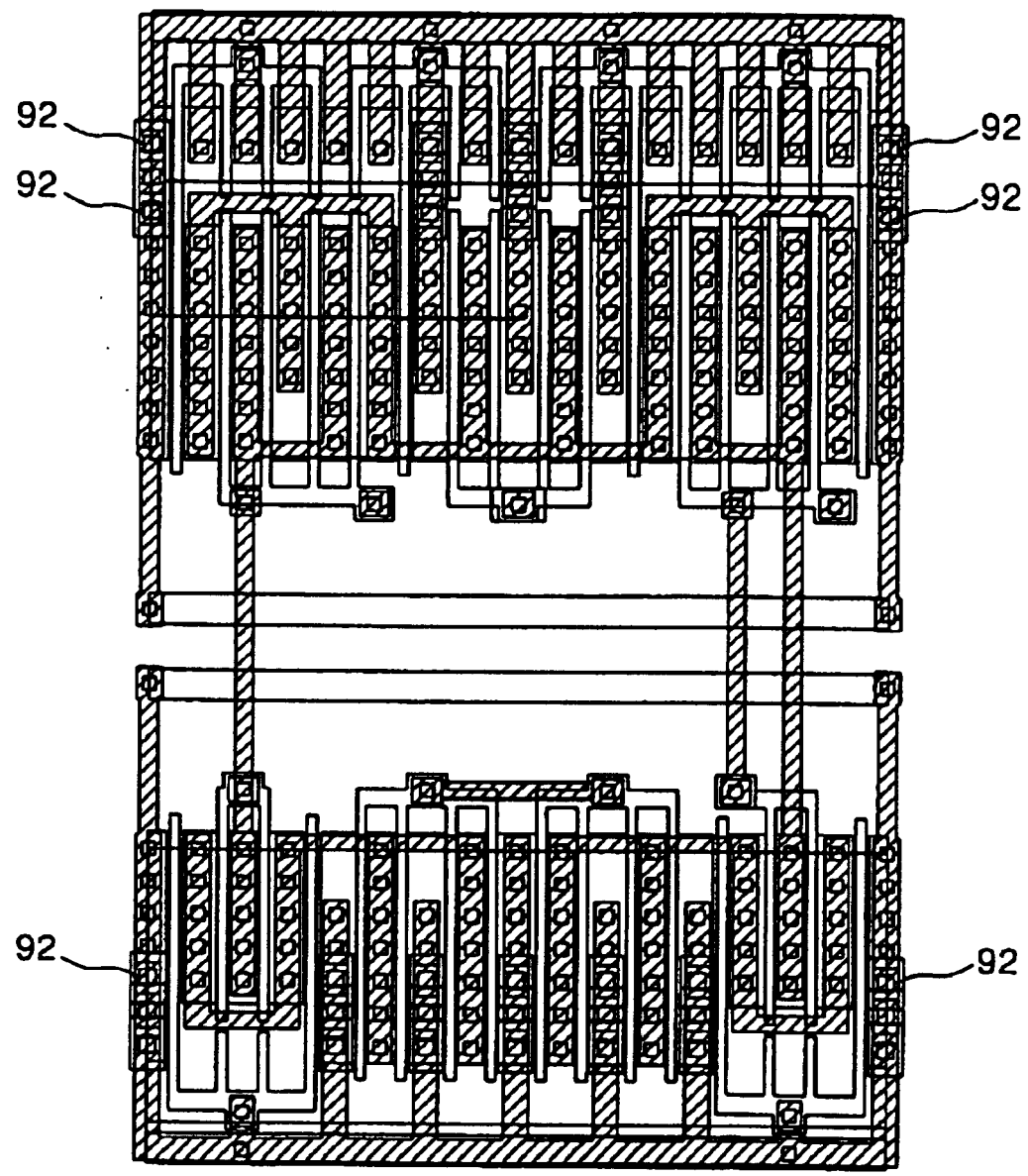
FIG. 15 illustrates contacts formed at the metals shown in FIG. 14.

FIG. 15 illustrates contacts formed at the metals ME1 shown in FIG. 14, and the portions 92 marked with dark squares indicate where the contacts are formed.

Figure 16:
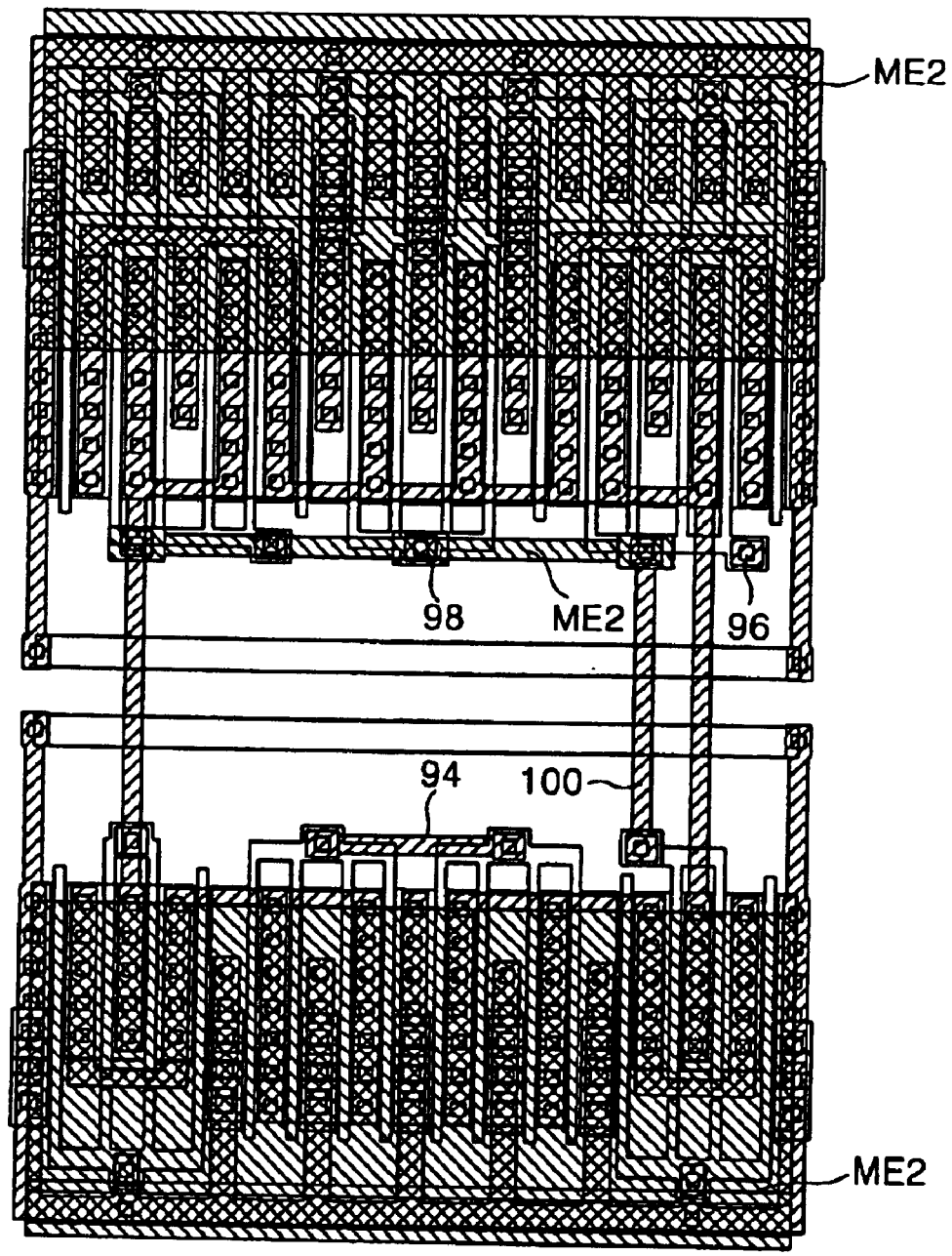
FIG. 16 illustrates metal lines formed along with the contacts shown in FIG. 15.

FIG. 16 illustrates metal lines formed along with the contacts shown in FIG. 15, and the portions ME2 marked with vertically slanting lines are where the metals are formed. Thus, the transistors of the sense amplifier shown in FIG. 4 are connected with metals. The metal lines 94, 96, 98, 100 respectively indicate a control signal CON applying line, a data D input line, another data DB input line and an output signal OUT generating line.

Figure 17:
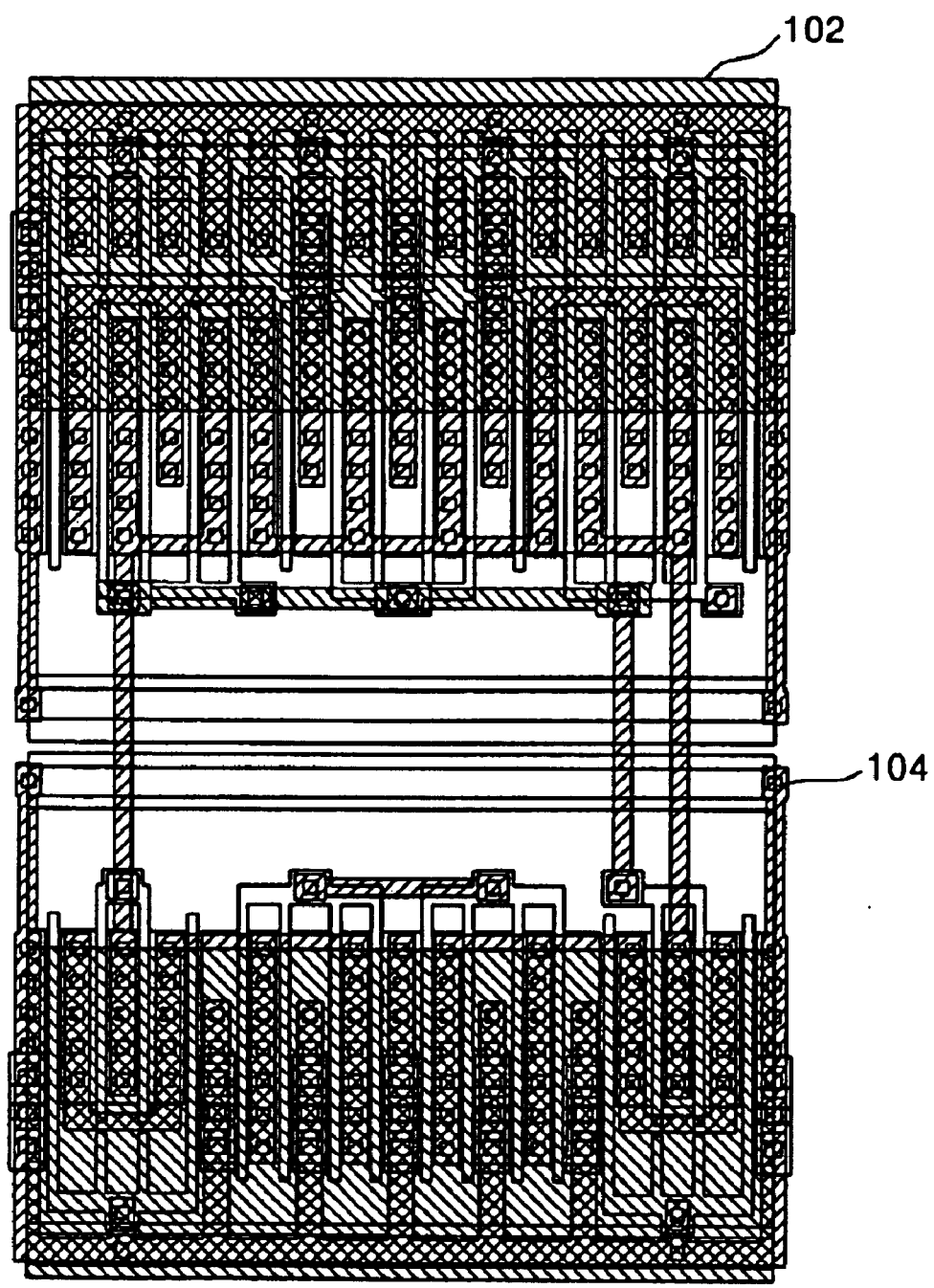
FIG. 17 illustrates a power voltage applying line and a grounding voltage applying line.

A power voltage applying line 102 and a grounding voltage applying line 104 are id illustrated in FIG. 17.

FIG. 12 illustrates the layout method of the sense amplifiers in accordance with another embodiment of the present invention. However, the layout shown in FIGS. 13 through 17 may be in a different arrangement. The drawings shown in FIGS. 13 through 17 here are to show an actual example of the sense amplifier in accordance with the present invention.

It is a unique characteristic of the present invention that the dummy gates having no influence upon actual operations of transistors are arranged between and outside the gates formed for actual operations of transistors. In accordance with the invention, all of those divided gates are arranged at a constant gap, thereby minimizing the variances in process deviations that may occur in the photo and etching processes.

In the aforementioned embodiment, the dummy gates are arranged between and outside the gates of transistors. However, it may be also possible for the dummy gates to be arranged only between the gates of transistors.

Figure 18:
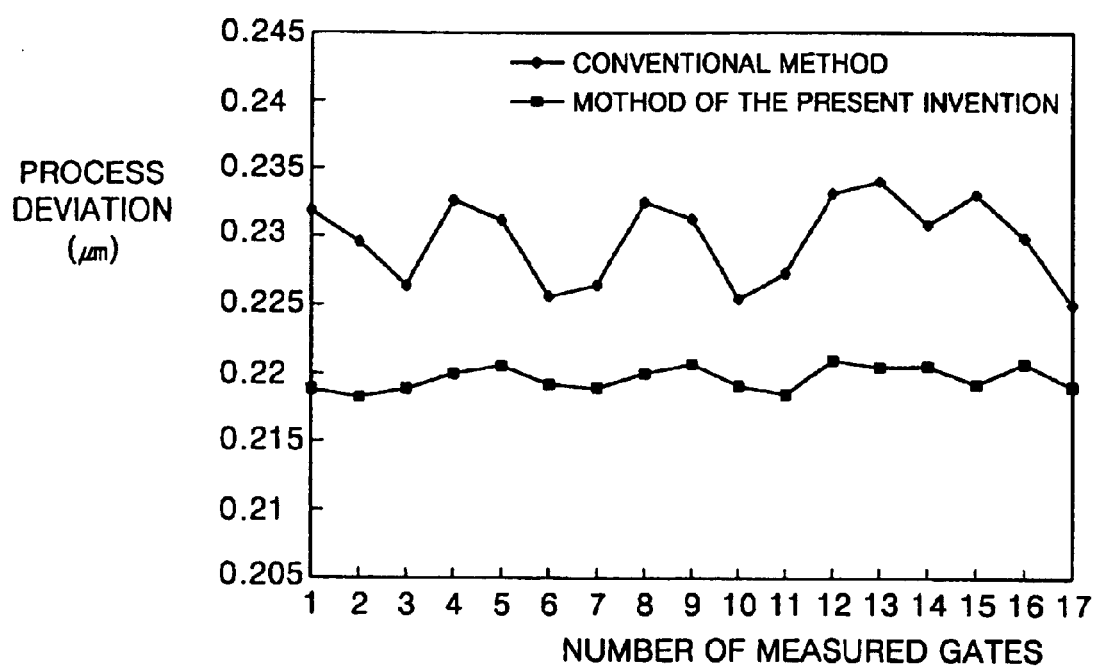
FIG. 18 is a graph illustrating variances in process deviations in accordance with the conventional layout method and the layout method of the present invention.

FIG. 18 is a graph for illustrating variances of the process deviations in case layouts of the semiconductor device are made in accordance with the conventional method or that of the present invention. The horizontal axis shows the number of measured gates while the vertical axis shows the process deviations (that is, the length gm of the gates respectively measured).

After the gates of transistors of the semiconductor device are manufactured in accordance with a conventional layout method or that of the present invention, the process deviations of those seventeen gates are measured. As a result, it has been found that the gates of the transistors arranged in the layout method of the present invention shows a smaller variances in process deviations than that of the conventional layout method. The maximum, minimum and average values of process deviations and its variance are shown in the following Table.

| unit ($\mu$m) | conventional method | method of the present invention |
| --- | --- | --- |
| maximum process deviation | 0.234 $\mu$m | 0.221 $\mu$m |
| minimum process deviation | 0.226 $\mu$m | 0.218 $\mu$m |
| average process deviation | 0.233 $\mu$m | 0.223 $\mu$m |
| variance in deviation ($\mu$m) | 0.008 $\mu$m | 0.003 $\mu$m |

As shown in Table, the variances in process deviations has been decreased by as much as 0.005 m when the layout method of the present invention is applied instead of the conventional layout method.

As shown in the aforementioned embodiment of the present invention, the layout method of the sense amplifier of the semiconductor device has been explained. Also, the layout method of the present invention may be applied to the semiconductor device or the neighboring circuits of the semiconductor memory device, thereby minimizing the variances in process deviations.

Furthermore, the transistors to which the data signals of the sense amplifier are input and the transistors to which the enable signals of the sense amplifier are input, that is, the PMOS transistors P1, P2, P3 and the NMOS transistors N1, N2, N3, N4 of the circuit shown in FIG. 4, are arranged in accordance with the layout method of the present invention, thereby m9 reducing the variances in process deviations and difference of the threshold voltage.

According to the layout method of the present invention, all the gates of the transistors which compose of circuits of the semiconductor device or other neighboring circuits of the semiconductor memory device are arranged at a constant gap by additionally installing dummy gates.

The dummy gates are arranged to keep all those gates at a constant gap between and outside (or only between) the gates which have been already formed for actual operations, thereby minimizing the variances in process deviations which may occur in the photo and etching processes.

Therefore, there is an advantage in the layout method of the present invention in that the dummy gates are additionally installed to arrange the gates of the transistors composing of the neighboring circuits at a constant gap, thereby minimizing the variances in process deviations.

In addition, there is another advantage in the layout method of the present invention in that the variances in process deviations is minimized to reduce the difference in the threshold voltage, thereby improving reliability of the semiconductor memory device.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A semiconductor device comprising:
   a substrate;
   a plurality of active regions each having at least two transistors and at least two electrodes disposed on the substrate;
   a plurality of transistor gates disposed on the substrate in each active region between the at least two electrodes, wherein at least two transistor gates are of a predetermined width and length and separated by a substantially identical gap with no intervening structures between the at least two transistor gates; and
   a plurality of dummy gates having the predetermined width and length and located between the at least two transistors, wherein at least two dummy gates are separated from an adjacent transistor gate by the substantially identical gap, and wherein the plurality of dummy gates are separated from each other by the substantially identical gap.

2. The device, as defined in claim 1, wherein the length of the dummy gates is substantially the same as that of the transistor gates.

3. The device, as defined in claim 1, wherein at least two gate transistors of each of the at least two transistors has a common terminals, the common terminal commonly connected on the substrate.

4. The device, as defined in claim 1, wherein the plurality of dummy gates is commonly connected on the substrate.

5. A semiconductor device comprising:
   a substrate;
   a plurality of active regions comprising at least two transistors, the active regions having at least two electrodes disposed on the substrate;
   a plurality of transistor gates disposed between the at least two electrodes, the transistor gates being positioned such that at least two transistor gates are of a predetermined width and length with a substantially identical gap separating the at least two transistor gates with no intervening structures between the at least two transistor gates; and
   a plurality of dummy gates having the predetermined width and length and located between and to either side of the at least two transistors, wherein at least four dummy gates are separated from an adjacent transistor gate by the substantially identical gap, and wherein each of the plurality of dummy gates is separated from another dummy gate by the substantially identical gap.

6. The device, as defined in claim 5, wherein the length of the dummy gates is substantially the same as that of the transistor gates.

7. The device, as defined in claim 5, wherein at least two gate transistors of each of the at least two transistors has a common terminal the common terminal commonly connected on the substrate.

8. The device, as defined in claim 5, wherein the plurality of dummy gates is commonly connected on the substrate.

9. A semiconductor device comprising:
   a substrate;
   a plurality of active regions comprising at least two transistors having at least more than one first and second two electrodes disposed on the substrate;
   a plurality of transistor gates disposed between the at least two electrodes, the transistor gates being positioned such that at least two transistor gates have a predetermined width and length with a substantially identical gap separating the at least two transistor gates with no intervening structures between the at least two transistor gates; and
   a plurality of dummy gates having the predetermined width and length and located not between but to both sides of the at least two transistors, wherein at least two dummy gates are separated from an adjacent transistor gate by the substantially identical gap, and wherein each of the plurality of dummy gates is separated from another dummy gate by the substantially identical gap.

10. The device, as defined in claim 9, wherein the length of the dummy gates is substantially the same as that of the transistor gates.

11. The device, as defined in claim 9, wherein at least more than one gate of a plurality of transistors respectively have common terminals each of which is commonly connected on the substrate.

12. The device, as defined in claim 9, wherein a plurality of dummy gates are commonly connected on the substrate.

13. A semiconductor device comprising
   a substrate;
   a first region having a plurality of first active regions each having a source region and a drain region respectively and a first portion other than the plurality of first active regions on the substrate;
   a second region having a plurality of second active regions each having a source region and a drain region respectively and a second portion other than the plurality of second active regions on the substrate;
   a plurality of first transistor gates formed on the plurality of first active regions, disposed between the source region and the drain region, the plurality of first transistor gates being characterized by a first gap between neighboring first transistor gates and without intervening structure between neighboring first transistor gates;
   a plurality of second transistor gates formed on the plurality of second active regions, the plurality of second transistor gates also being characterized by the first gap between neighboring second transistor gates;
   a plurality of first dummy gates formed on the first portion, the plurality of first dummy gates being characterized by a second gap between neighboring first dummy gates and without intervening first transistor gates between neighboring first dummy gates;
   a plurality of second dummy gates formed on the second portion, the plurality of second dummy gates also being characterized by the second gap between neighboring second dummy gates without intervening second transistor gates between neighboring second dummy gates;
   wherein a first transistor gate at an edge of the first active regions is separated from a first dummy gate at an edge of the first portion by a third gap, wherein a second transistor gate at an edge of the second active region is separated from a second dummy gate at an edge of the second portion by a fourth gap, and wherein the first, second, third, and fourth gaps are substantially identical;
   a first metal connected to the source and drain regions by a contact; and
   a second metal connected to a first part of the first metal to supply a voltage.

14. The semiconductor device according to claim 13, in which the first gap is substantially identical to the second gap.

15. The semiconductor device according to claim 13, in which the second metal is connected to a second part of the first metal to supply a ground voltage.

16. A semiconductor device comprising:
   a substrate;
   a plurality of active regions having at least two transistors and two electrodes disposed on the substrate;
   a plurality of transistor gates of a first width disposed on the substrate between the at least two electrodes of the active regions;
   a plurality of dummy gates of a second width disposed on the substrate between the at least two electrodes of the active regions; and
   a plurality of dummy gates of a third width disposed on the substrate between the at least two electrodes of the active regions, wherein each of the transistor gates is aligned along the same longitudinal axis as a corresponding one of the dummy gates of a third width, and wherein the second width is greater than the sum of the first and third widths.

17. The semiconductor device according to claim 16, in which the plurality of transistor gates and of the plurality dummy gates are of substantially identical gap between gates.

18. The device, as defied in claim 16, wherein the length of the dummy gates is substantially the same as that of the transistor gates.

19. The device, as defined in claim 16, wherein at least more than one gate of a plurality of transistors respectively have common terminals each of which is commonly connected on the substrate.

20. The device, as defined in claim 16, wherein a plurality of dummy gates are commonly connected on the substrate.

21. The device, as defined in claim 16, wherein the width of the dummy gates is substantially the same as that of the transistor gates.

22. A semiconductor device comprising:
   a substrate;
   a plurality of active regions having at least two transistors and at least two electrodes disposed on the substrate;
   a plurality of transistor gates disposed on the substrate between the at least two electrodes of the active regions, at least two transistor gates having a first portion extending in a first direction and a plurality of second portions extending in a second direction perpendicular to the first direction; and
   a plurality of dummy gates, each having a first portion extending in the first direction and in contact with a bias line, each having at least one second portions extending in the second direction and disposed on the substrate such that the at least one second portion is interspaced between the at least two transistors;

wherein a gap between adjacent second portions of the at least two transistor gates and a gap between adjacent second portions of the dummy gates are substantially identical to a gap between a second portion of a transistor gate and an adjacent second portion of a dummy gate wherein a physical dimension of the second portions of the at least two transistor gates in the first direction is substantially identical to a physical dimension of the second portions of the plurality of dummy gates in the first direction;

and wherein the plurality of transistors and the plurality of dummy gates are commonly connected on the substrate, respectively.

* * * * *

UNITED STATES PATENT AND TRADEMARK OFFICE
CERTIFICATE OF CORRECTION

PATENT NO.         : 6,872,990 B1                                    Page 1 of 1
APPLICATION NO. : 09/458506
DATED              : March 29, 2005
INVENTOR(S)       : Kang It is certified that error appears in the above-identified patent and that said Letters Patent is hereby corrected as shown below:

At column 3, line 62, please replace "30.2...30n" with --30-2...30n--

At column 6, line 60, please replace "104 are id illustrated" with --104 are illustrated--

At column 7, line 18, please replace "the length gm of the" with --the length $\mu$m of the--

At column 7, line 41, please replace "0.005m when the" with --0.005$\mu$m when the--

At column 7, line 58, please replace "thereby m9 reducing" with --thereby reducing--

At column 8, line 44, please replace "common terminals," with --common terminal,--

At column 10, line 44, please replace "as defied in" with -- as defined in--

At column 11, line 1, please replace "second portions" with --second portion--

Signed and Sealed this

Eighth Day of August, 2006

JON W. DUDAS
*Director of the United States Patent and Trademark Office*